(12) United States Patent
Farnworth et al.

(10) Patent No.: US 6,271,056 B1
(45) Date of Patent: *Aug. 7, 2001

(54) STACKED SEMICONDUCTOR PACKAGE AND METHOD OF FABRICATION

(75) Inventors: Warren M. Farnworth, Nampa; Alan G. Wood, Boise; Mike Brooks, Caldwell, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,861

(22) Filed: Mar. 1, 1999

Related U.S. Application Data

(62) Division of application No. 09/092,779, filed on Jun. 5, 1998, now Pat. No. 6,020,629.

(51) Int. Cl.[7] .................................................. H01L 21/44
(52) U.S. Cl. ........................ 438/106; 438/118; 257/685; 257/686
(58) Field of Search ............................ 257/685; 438/118, 438/106

(56) References Cited

U.S. PATENT DOCUMENTS

| | | | |
|---|---|---|---|
| 4,505,799 | 3/1985 | Baxter | 204/416 |
| 4,996,587 | * 2/1991 | Hinrichsmeyer et al. | 357/74 |
| 5,063,177 | 11/1991 | Geller et al. | 437/209 |
| 5,107,328 | 4/1992 | Kinsman | 357/74 |
| 5,138,434 | 8/1992 | Wood et al. | 357/74 |
| 5,155,067 | 10/1992 | Wood et al. | 437/209 |
| 5,229,647 | 7/1993 | Gnadinger | 257/785 |
| 5,266,912 | 11/1993 | Kledzik | 333/247 |
| 5,334,857 | 8/1994 | Meanitt et al. | . |
| 5,384,689 | 1/1995 | Shen | . |
| 5,440,240 | * 8/1995 | Wood et al. | 324/765 |
| 5,444,296 | 8/1995 | Kaul et al. | . |
| 5,468,999 | 11/1995 | Lin et al. | 257/784 |
| 5,474,957 | 12/1995 | Urushima | 437/209 |
| 5,562,971 | * 10/1996 | Tsuru et al. | 428/209 |
| 5,633,530 | 5/1997 | Hsu | . |
| 5,646,828 | 7/1997 | Degani et al. | 361/715 |
| 5,674,785 | 10/1997 | Akram et al. | 437/217 |
| 5,677,566 | * 10/1997 | King et al. | 257/666 |
| 5,689,091 | 11/1997 | Hamzehdoost et al. | . |
| 5,696,033 | 12/1997 | Kinsman | 437/217 |
| 5,723,900 | 3/1998 | Kojima et al. | . |
| 5,739,585 | 4/1998 | Akram et al. | 257/698 |
| 5,753,857 | 5/1998 | Choi | . |
| 5,763,939 | 6/1998 | Yamashita | . |
| 5,789,803 | 8/1998 | Kinsman | 257/666 |
| 5,796,038 | 8/1998 | Manteghi | . |
| 5,811,579 | 9/1998 | Akram | . |
| 5,981,314 | * 11/1999 | Glenn et al. | 438/127 |
| 6,013,948 | 1/2000 | Akram et al. | . |
| 6,020,629 | 2/2000 | Farnworth et al. | . |
| 6,072,323 | * 6/2000 | Hembree et al. | 324/755 |
| 6,107,109 | 8/2000 | Akram et al. | . |

* cited by examiner

Primary Examiner—John F. Niebling
Assistant Examiner—Olivia Luk
(74) Attorney, Agent, or Firm—Stephen A. Gratton

(57) ABSTRACT

A semiconductor package and a method for fabricating the package are provided. The package includes multiple substrates in a stacked configuration, each having a semiconductor die mounted thereon. Each substrate includes matching patterns of external contacts and contact pads formed on opposing sides of the substrate, and interconnected by interlevel conductors through the substrate. In the package, the external contacts on a first substrate are bonded to the contact pads on an adjacent second substrate, so that all of the dice in the package are interconnected. The fabrication process includes forming multiple substrates on a panel, mounting the dice to the substrates, stacking and bonding the panels to one another, and then separating the substrates from the stacked panels to form the packages.

21 Claims, 2 Drawing Sheets

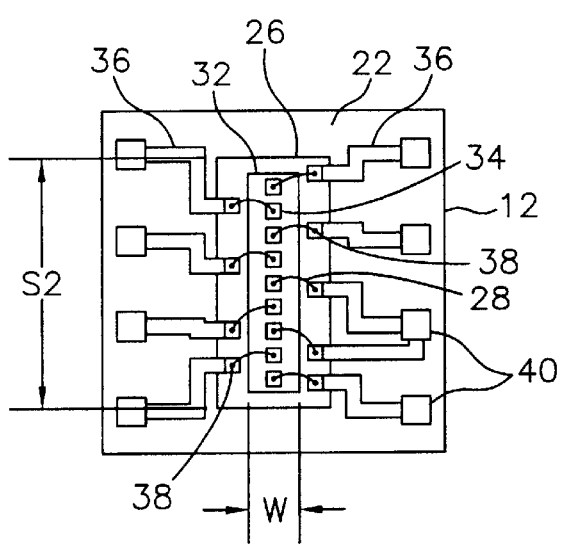
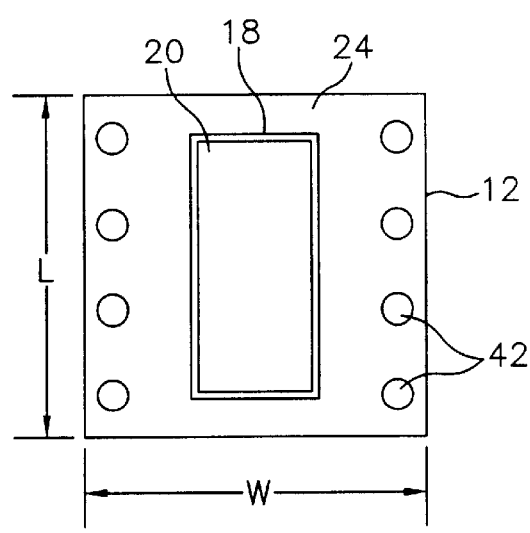
FIGURE 3
FIGURE 4

STACKED SEMICONDUCTOR PACKAGE AND METHOD OF FABRICATION

CROSS REFERENCE TO RELATED APPLICATIONS

This application is a division of application Ser. No. 09/092,779, filed on Jun. 5, 1998 U.S. Pat. No. 6,020,629.

FIELD OF THE INVENTION

This invention relates generally to semiconductor packaging. More particularly, this invention relates to an improved semiconductor package having a stacked configuration and containing multiple semiconductor dice, and to a method for fabricating the package.

BACKGROUND OF THE INVENTION

Semiconductor dice or chips are typically contained in semiconductor packages. This is sometimes referred to as the first level of packaging. The package is required to support, protect, and dissipate heat from a die, and to provide a lead system for power and signal distribution to the die. The package is also useful for performing burn-in and full functionality testing of the die.

In general, conventional plastic and ceramic packages incorporate several common elements. These common elements include a sealed package enclosure, a die attachment area, bond wires for establishing electrical communication with bond pads on the die, and a lead system for the package. One shortcoming of a conventional semiconductor package is that a peripheral outline (i.e., footprint) of the package is typically much larger than that of the die contained within the package (e.g., 10× or more). In addition, the manufacturing processes for conventional packages are relatively complicated, and require large capital expenditures.

Another type of package is referred to as a ball grid array (BGA) package. With this type of package, a substrate formed of a glass filled resin, or similar material, includes patterns of conductors in electrical communication with arrays of external contacts. One or more dice can be wire bonded to the conductors, and protected by a plastic material, such as a glob top encapsulant. A ball grid array package has a peripheral outline that is on the order of two to eight times that of the die. While the size is an improvement over conventional packages, this type of package also requires relatively complicated manufacturing processes, and has not received widespread acceptance in the industry.

Yet another type of package is referred to as a chip scale package. Typically, a chip scale package includes a substrate bonded to a face of a single die. The substrate includes external contacts for the package, such as solder balls in a ball grid array (BGA), or in a fine ball grid array (FBGA). The substrate for a chip scale package can comprise a flexible material, such as a polymer tape, or a rigid material, such as silicon, ceramic, or a glass filled resin. A chip scale package has a peripheral outline that is about the same as that of the die contained within the package (e.g., 1.2×). However, volume manufacture of chip scale packages has proven to be difficult. In particular forming reliable electrical connections between the die and substrate requires specialized equipment and techniques.

The present invention is directed to a semiconductor package that is simpler in construction, and cheaper to volume manufacture than any of the above conventional packages. In addition, the package has a relatively small peripheral outline, but is designed for fabrication in a stacked configuration, in which multiple dice can be contained in the same package.

SUMMARY OF THE INVENTION

In accordance with the present invention, a stacked semiconductor package, and a method for fabricating the package are provided. The package comprises a plurality of separate substrates, each having a semiconductor die mounted thereon, in electrical communication with external contacts and contact pads on opposing sides of the substrate. The substrates are configured for stacking to one another with the external contacts on a first substrate, bonded to the contact pads on an adjacent second substrate. In addition, the substrates are configured to provide a small outline package but with multiple semiconductor dice packaged in a high density configuration.

In an illustrative embodiment a first side of a substrate includes a wire bonding cavity having conductors in electrical communication with a pattern of contact pads. A second side of the substrate includes a die mounting cavity, and a matching pattern of external contacts. An interconnect opening is formed through the substrate to provide access for wire bonding to bond pads on the die, and to the conductors on the first side of the substrate. In addition, an encapsulant can be formed within the wire bonding cavity to encapsulate and protect the wire bonds and associated wires. Preferably the encapsulant and the wire bonding cavity are configured to provide a planar surface to facilitate stacking of the substrate. In a similar manner, the die and the die mounting cavity can be configured to provide a planar surface for stacking of the substrate.

The substrate also includes interlevel conductors for electrically interconnecting the contact pads on the first side of the substrate to the external contacts on the second side of the substrate. The interlevel conductors comprise holes through the substrate and containing a metal, or a conductive elastomeric material.

The external contacts are configured for bonding to the contact pads of the adjacent stacked substrate. For example, the external contacts can be formed of a bondable material such as a solder, and the contact pads can be formed of a solder wettable material such as copper. Alternately, the external contacts can comprise a conductive elastomer deposited as a viscous paste, and then cured to form an electrically conductive bond with the contact pads. A conductive elastomer can also be placed between the external contacts and contact pads to form a conductive bond therebetween.

The method of fabrication can be performed using panels containing multiple substrates. Exemplary materials for fabricating the panels include glass filled resins, plastics, ceramic and silicon. Following fabrication of the panels, semiconductor dice can be adhesively bonded to the die mounting cavities on the first sides of the panels, and then wire bonded to the conductors on the second sides of the panels. Following encapsulation of the wire bonds, two or more panels can be stacked to one another, with the external contacts and contact pads on adjacent stacked panels in physical contact. Using a bonding process, such as a solder reflow, or a conductive elastomer curing process, the external contacts and contact pads on the adjacent stacked panels can then be bonded to one another. Following bonding, the stacked panels can be separated into separate packages using a cutting, shearing or breaking process.

BRIEF DESCRIPTION OF THE DRAWINGS

FIG. 3 is a schematic plan view of a semiconductor package taken along section line 3—3 of FIG. 2C; and FIG. 4 is a schematic bottom view of the semiconductor package taken along section line 4—4 of FIG. 2C.

DETAILED DESCRIPTION OF THE PREFERRED EMBODIMENTS

Figure 1:
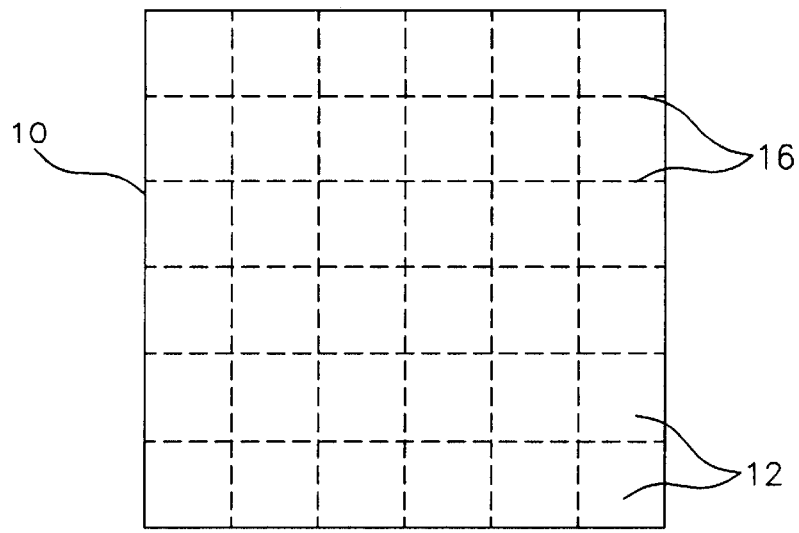
FIG. 1 is a schematic plan view of a panel suitable for fabricating semiconductor packages in accordance with the method of the invention.

Referring to FIG. 1, a panel 10 includes a plurality of substrates 12 adapted to construct stacked semiconductor packages 14 (FIG. 2D) in accordance with the invention. In the illustrative embodiment the panel 10 contains thirty six substrates 12. However, the panel 10 can be formed with any convenient number of substrates 12. The substrates 12 can be formed on the panel using processes to be hereinafter described.

In the illustrative embodiment, the panel 10 comprises a glass filled resin such as an epoxy glass (FR-4), a polyimide glass or a cyanate-glass material. In addition to being electrically insulating and structurally rigid, these materials can be laminated, cured, and then metallized using deposition and photolithography processes. Also, required features can be punched or machined using processes employed in the fabrication of printed circuit boards (PCB), and other electronic devices.

Alternately, rather than the above materials, the panel 10 can comprise an electronics grade plastic, such as polyetherimide (PES), polyethersulfone (PES), polyether-ether ketone (PEEK), polyphenylene sulfide (PPS), or a liquid crystal polymer (LCP). With these plastics the panel 10 and substrates 12 can be shaped and metallized using a molding process such as 3-D injection molding.

Alternately, the panel 10 can comprise ceramic. With ceramic, a ceramic lamination and metallization process can be used to construct the panel 10 and substrates 12.

As another alternative, the panel 10 can comprise silicon, or other semiconducting material. With silicon, etching, micromachining, and metallization processes used for semiconductor circuit fabrication can be used to construct the panel 10 and substrates 12. One advantage of silicon is that a coefficient of thermal expansion (CTE) of the substrates 12 will exactly match the CTE of a silicon die.

The panel 10 can include boundary lines 16 for defining the peripheral outlines of the substrates 12. The boundary lines 16 can be configured to facilitate separation of the substrates 12 from the panel 10. For example, to facilitate separation, the boundary lines 16 can include perforations through the panel 10, similar to perforations for separating crackers. Alternately, the boundary lines 16 can be similar to scribe lines on semiconductor wafers, such as areas wherein the panel 10 is adapted to be cut, or sheared, using a suitable mechanism, such as a saw. The boundary lines 16 can also be omitted and the separation process used to define the peripheral outlines of the substrates 12.

Referring to FIGS. 2A–2D, steps in the method for fabricating the stacked semiconductor package 14 (FIG. 2D) are illustrated. For simplicity, only a single substrate 12 is illustrated in FIGS. 2A–2D. However, it is to be understood that each of the steps is performed on the panel 10 (FIG. 1) containing multiple substrates 12.

Figure 2A:
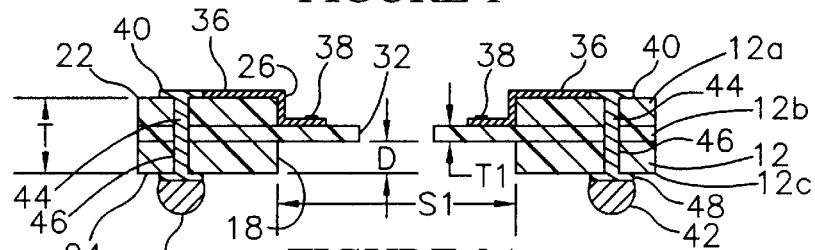
FIGS. 2A–2D are schematic cross sectional views illustrating steps in the method of the invention.

As shown in FIG. 2A, the substrate 12 includes three separate layers 12a, 12b, 12c, that have been pre-formed and then laminated to form a unitary structure. A first substrate layer 12a includes a first side 22 of the substrate 12. A second substrate layer 12b forms a middle portion of the substrate 12. A third substrate layer 12c includes a second side 24 of the substrate. The first side 22 and the second side 24 of the substrate 12 are generally planar opposing surfaces which are substantially parallel to one another.

By way of example, a representative thickness "T" (FIG. 2A) of the substrate 12 can be from 0.5 mm to 3.0 mm. A representative length "L" (FIG. 4) of the substrate 12 can be from 1 mm to 50 mm. A representative width "W" (FIG. 4) of the substrate 12 can be from 1 mm to 50 mm.

Figure 2B:
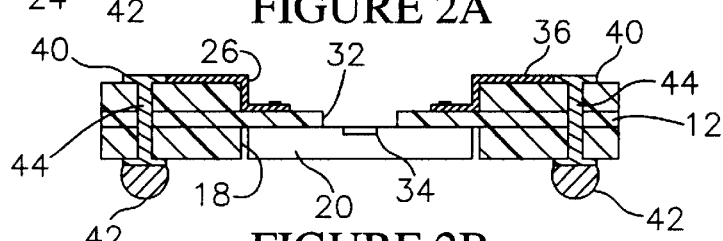

A die mounting cavity 18 is formed in the substrate 12 proximate to the second side 24 of the substrate 12. The die mounting cavity 18 is configured to receive a semiconductor die 20 (FIG. 2B). The die mounting cavity 18 can have a peripheral outline that corresponds to a peripheral outline of the die 20. In the illustrative embodiment, the peripheral outline is rectangular, but can also be square or other polygonal shape.

The die mounting cavity 18 can be slightly larger than the die 20 (e.g., a few mils on each side) to permit insertion of the die 20 into the cavity 18. A representative size of the die mounting cavity 18 along a first side S1 (FIG. 2A) can be from 0.3 mm to 12.5 mm. A representative size of the die mounting cavity along a second side "S2" (FIG. 3) can be from 0.3 mm to 12.5 mm. In addition, a depth "D" (FIG. 2A) of the die mounting cavity 18 can be approximately equal to a thickness of the die 20 to preserve a planarity of the second side 24 of the substrate 22 with the die 20 mounted to the cavity 18. A representative depth "D" for the die mounting cavity 18 can be from 0.10 mm to 1.0 mm. Still further, outside edges of the die mounting cavity 18 can be chamfered, or radiused, to facilitate insertion of the die 20 into the cavity 18.

The substrate 12 also includes a wire bonding cavity 26 formed in the substrate 12 proximate to the first side 22 of the substrate 12. The wire bonding cavity 26 is sized to protect bond wires 28 (FIG. 2C) or a similar electrical path. Additionally, the wire bonding cavity 26 is configured to contain an encapsulant 30 that will subsequently be deposited into the wire bonding cavity 26. In the illustrative embodiment, the wire bonding cavity 26 has a peripheral outline and a depth that are about the same as the die mounting cavity 18.

The substrate 12 also includes an interconnect opening 32 formed through the substrate 12 from the die mounting cavity 18 to the wire bonding cavity 26. The interconnect opening 32 is configured to provide access to the die 20 (FIG. 2B) for wire bonding the bond wires 28 to die bond pads 34 (FIG. 2B). As shown in FIG. 3, the interconnect opening 32 has a generally rectangular shaped peripheral configuration. In addition, the interconnect opening 32 is located to align with the die bond pads 34, when the die 20 is mounted within the die mounting cavity 18. A representative width "w" (FIG. 3) of the interconnect opening 32 can be from 0.2 mm to 45 mm. A representative thickness "T1" of the portion of the substrate 12 which forms the interconnect opening 32 can be from 0.1 mm to 0.5 mm.

With the substrate 12 comprising a glass resin, or a plastic material, the die mounting cavity 18, the wire bonding cavity 26 and the interconnect opening 32 can be formed with required sizes and shapes using an injection molding process. With the substrate 12 comprising a ceramic, a lamination process can be used to define the die mounting cavity 18, the wire bonding cavity 26 and the interconnect opening 26. With the substrate 12 comprising silicon, an etch process can be used to etch the die mounting cavity 18, the wire bonding cavity 26 and the interconnect opening 32. One suitable wet etchant for etching silicon is a solution of KOH and H$_2$O. This type of etching is also known as bulk micro machining.

The substrate 12 also includes patterns of conductors 36 formed on the first side 22. As shown in FIG. 2A, the conductors 36 extend into the wire bonding cavity 26. In addition, the conductors 36 include bond pads 38 to which the bond wires 28 are wire bonded. Also, the conductors 36 are in electrical communication with contact pads 40 on the first side 22 of the substrate, with interlevel conductors 44 through the substrate 12, and with external contacts 42 on the second side 24 of the substrate 12. FIG. 3 illustrates an exemplary layout for the conductors 36, the bond pads 38 and the contact pads 40.

Figure 2C:
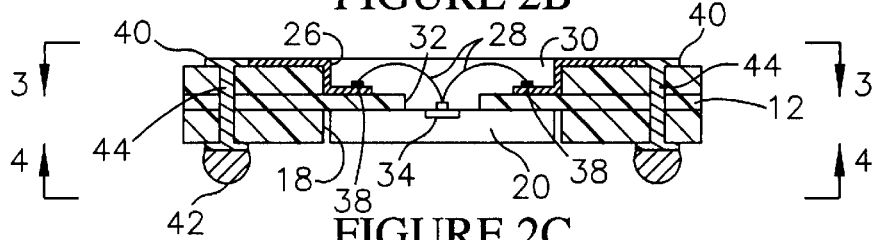
Figure 2D:
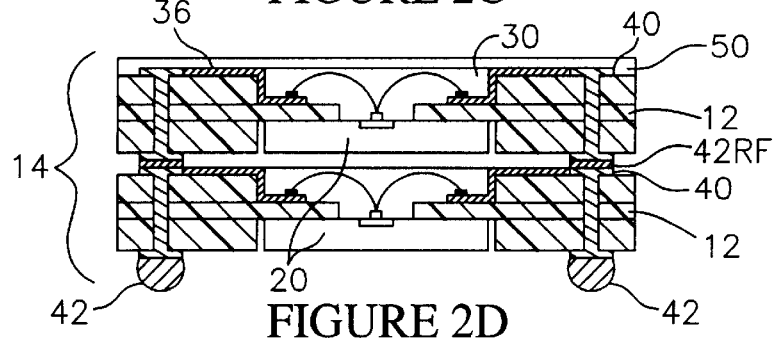

As shown in FIG. 2D, the contact pads 40 are adapted for bonding to external contacts 42 on an adjacent substrate 12A (FIG. 2D). The adjacent substrate 12A has a configuration that is substantially the same as the configuration of the substrate 12. As will be further explained, a bonding process, such as reflow of a solder material, or curing of a conductive elastomer material, can be used to bond the external contacts 42 on the adjacent substrate 12A to the contact pads 40 on the substrate 12. With the adjacent external contacts 42 comprising a solder material, the contact pads 40 preferably comprise a solder wettable material such as copper. In order to facilitate the bonding process, a pattern of the contact pads 40 on the first side 22 of the substrate 12, exactly matches a pattern of the external contacts on the second side 24 of the substrate 12.

The conductors 36, bond pads 38 and contact pads 40 can be fabricated using a conventional metallization process. For example, a metal layer, such as copper, can be formed on the first side 22 of the substrate 12 using foil lamination, electrolytic plating, electroless plating, or CVD deposition. A resist layer can then be deposited on the metal layer, and patterned using photolithography to form a resist mask. The resist mask can then be used to subtractively etch the metal layer to form the conductors 36, the bond pads 38 and the contact pads 40. Alternately, the conductors 36, bond pads 38 and contact pads 40 can be formed using an additive process in which a resist mask is formed and then used to plate a metal such as copper in the required pattern. A seed or nucleation step can also be employed to prep the surface of the substrate 12 for plating.

As shown in FIG. 2A, the interlevel conductors 44 electrically connect the contact pads 40 on the first side 22 of the substrate 12, to the external contacts 42 on the second side 24 of the substrate 12. The interlevel conductors 44 comprise holes 46 in the substrate 12 which contain an electrically conductive material. Depending on the material of the substrate 12, the holes 46 for the interlevel conductors 44 can be formed using a suitable process such as drilling, punching, molding or etching. Preferably, formation of the holes 46 is prior to formation of the conductors 36.

The holes 46 for the interlevel conductors 44 can also be formed using a laser machining process. A suitable laser machining apparatus is manufactured by General Scanning of Sommerville, Mass. and is designated a model no. 670-W. A representative diameter of the holes 46 is from 10 μm to 2 mils or greater. A representative laser fluence for forming the holes 46 with the substrate 12 having a thickness of about 28 mils is from 2 to 10 watts/per hole at a pulse duration of 20–25 ns and at a repetition rate of up to several thousand per second. The wavelength of the laser beam can be a standard infrared or green wavelength (e.g., 1064 nm-532 nm).

Following formation of the holes 46, a conductive material can be deposited in the holes 46. One method of deposition comprises plating a metal, such as copper or nickel, on the walls of the holes 46 using an electrolytic or electroless plating process. A plating process can also be used to completely fill the holes 46 with a metal. Alternately, rather than a metal, the holes 46 can be at least partially filled with an isotropic conductive elastomer, such as epoxy or silicone with embedded metal particles. Suitable conductive elastomers are sold by A. I. Technology, Trenton, N.J.; Sheldahl, Northfield, Minn.; and 3M, St. Paul, Minn. In this case, a squeegee or similar mechanism can be used to force the viscous conductive elastomer into the holes 46. Following deposition, the viscous conductive elastomer can be cured by heating to a required temperature for a required time period.

Plating, or filling, of the holes 46 to form the interlevel conductors 44 can be either prior to or subsequent to formation of the contact pads 40 and the conductors 36. In either case, the conductive material within the holes 46 must be in electrical contact with the contact pads 40 and with the conductors 36. Also, depending on the material and deposition process, the contact pads 40 can comprise a same material as the conductive material which is deposited in the holes 46 (e.g., copper), and can be formed using the same process (e.g., plating). Alternately, the contact pads 40 and interlevel conductors 44 can be different material formed using different processes. For example, the contact pads 40 can be formed first using a metallization process, and a conductive elastomeric material placed in the holes 46 from the second side 24 of the substrate 12.

Still referring to FIG. 2A, the interlevel conductors 44 can include pads 48 for attaching the external contacts 42 to the second side 24 of the substrate 12. The pads 48 provide a surface for mounting the external contacts 42. Any of the deposition processes previously described for forming the contact pads 40, can be used to form the pads 48 for the external contacts 42. As with the contact pads 40, the pads 48 can be a same material as the interlevel conductors 44, and can be formed by the same deposition process. Alternately, the pads 48 can be a different material than the interlevel conductors 44, and can be formed by a different deposition process. In addition, the pads 48 can comprise different layers of material, such as an underlying layer formed of a same material as the interlevel conductors 44, and an outer layer configured to provide adherence for the external contacts 42.

In the illustrative embodiment, the external contacts 42 comprise solder, a metal, or a conductive elastomeric bumps formed on the pads 48. Preferably the external contacts 42 comprise a solder alloy such as 95%Pb/5%Sn, 60%Pb/40%Sn, 63%In/37%Sn, or 62%Pb/36%Sn/2%Ag. This allows a solder reflow to be performed to reflow and bond the external contacts 42 to the contact pads 40 on an adjacent substrate 12. The external contacts 42 can also be formed of a metal such as nickel, copper, beryllium copper, alloys of nickel, alloys of copper, alloys of beryllium copper, nickel-cobalt-iron alloys and iron-nickel alloys. In this case a welding, brazing, or laser reflow process can be used to bond the external contacts 42 to the contact pads 40 on the adjacent substrate 12.

One method for attaching the external contacts 42 to the pads 48 is by bonding pre-fabricated solder or metal balls to the pads 48. For example, pre-fabricated balls are manufactured by Mitsui Comtek Corp. of Saratoga, Calif. under the trademark "SENJU SPARKLE BALLS". The balls can be attached to the pads 48 by soldering, laser reflow, brazing, welding, or applying a conductive adhesive. A solder ball bumper can also be used to bond the external contacts 42 to the pads 48. A suitable solder ball bumper is manufactured by Pac Tech Packaging Technologies of Falkensee, Germany. The external contacts 42 can also be formed on the pads 48 using a conventional wire bonder apparatus adapted to form a ball bond, and then to sever the attached wire. The external contacts 42 can also be formed by electrolytic deposition or electroless deposition of a metal to form bumps. A representative diameter for the external contacts 42 can be from about 4 mils to 50 mils or more. A pitch of the external contacts 42 can be from about 6 mils to 50 mils or more.

Rather than being a solder or a metal, the external contacts 42 can comprise a conductive elastomer, such as an isotropic or anisotropic adhesive. For example, the external contacts can comprise an anisotropic adhesive cured under compression. Alternately, the external contacts 42 can comprise elastomeric bumps deposited on the pads 48 in a semi cured condition, and then fully cured while in contact with the contact pads 40 on the adjacent substrate 12. Semi curing of the external contacts 42 permits full curing to be accomplished with external compression of the external contacts 42. Alternately, the external contacts 42 can comprise an anisotropic adhesive that is cured under compression.

Referring to FIG. 2B, following formation of the substrate 12, the die 20 can be attached to the die mounting cavity 18. For attaching the die 20 to the die mounting cavity 18, an adhesive, such as silicone, can be applied to the face of the die 20, or to the cavity 18 to form an adhesive layer therebetween. One suitable adhesive is "ZYMET" silicone elastomer manufactured by Zymet, Inc., East Hanover, N.J.

The die mounting cavity 18 and the interconnect opening 32 can be configured such that with the die 20 mounted to the die mounting cavity 18, the bond pads 34 align with the interconnect opening 32 to provide access for wire bonding of the bond wires 28 (FIG. 2C). In the illustrative embodiment, the die 20 can comprise a conventional semiconductor die, such as a lead on chip (LOC) die having the bond pads 34 formed along a center line of the die 20. However, this arrangement is merely exemplary, as dice having bond pads along the edges or ends thereof, can also be employed. In this case one or more interconnect openings (not shown) can be located between the die mounting cavity 18 and wire bonding cavity 26 to provide access to the bond pads on the die.

Referring to FIG. 2C, following mounting of the die 20 to the die mounting cavity 18, the bond wires 28 can be wire bonded to the bond pads 38 on the conductors 36, and to the bond pads 34 on the die 20. Wire bonding can be performed using a conventional wire bonder apparatus. During the wire bonding process the interconnect opening 32 provides access to the bond pads 34. In addition, the stepped surface of the wire bonding cavity 26 provides a bonding shelf wherein the bond pads 38 are located.

As also shown in FIG. 2C, following wire bonding, an encapsulant 30 can be deposited into the wire bonding cavity 26 to encapsulate the bond wires 28. One method for depositing the encapsulant 30 is a glob top encapsulation method. For example, the encapsulant 30 can comprise an epoxy, silicone, room temperature vulcanizing (RTV) or polyimide material. Suitable compounds are commercially available from Dexter/Hysol under the trademark of "HYSOL 4450 and 4451" and from Thermoset under the trademark of "EP-729". The encapsulant 30 can be dispensed using a suitable dispensing apparatus such as a needle and syringe. Suitable dispensing apparatus are commercially available from Asymtek under the trademarks "A-400" and "A-800" and from MRSI under the trademark "MRSI-170".

Preferably a surface of the encapsulant 30 is planarized to provide a planar surface for stacking. Planarization can be accomplished using a dam or mold placed over the wire bonding cavity 26, and having an opening for dispensing the encapsulant 30. A planarization process can also be performed following hardening of the encapsulant 30 using a polishing tool.

Referring to FIG. 2D, following formation thereof, the substrate 12 can be stacked to one or more adjacent substrates 12A to form the stacked semiconductor package 14. The adjacent substrate 12A can be fabricated exactly as previously described for substrate 12. In addition, external contacts 42 on the adjacent substrate 12A can be bonded to the contact pads 40 on the substrate 12 using a noncompressive, or compressive bonding technology. As the substrate 12 and adjacent substrate 12A are contained on panels 10 (FIG. 1), the stacking and bonding processes are performed using panels 10 containing multiple substrates 12.

One non-compressive bonding process for bonding the substrates is a solder reflow process. In FIG. 2D the external contacts 42 on the adjacent substrate have been reflowed and are designated as 42RF. For a reflow process, the external contacts 42RF preferably comprise solder, and the contact pads 40 preferably comprise a solder wettable material such as copper or aluminum. A thermode or laser source can be used to heat the external contacts 42RF to a molten state in order to form a permanent bond with the contact pads 40. Alternately with the external contacts 42RF comprising a metal other than solder (e.g., nickel), a brazing process or a welding process can be employed to bond the external contacts 42RF to the contact pads 40.

As another non-compressive alternative, a conductive adhesive material can be employed to form the bonded connections. In this case, either the external contacts 42 or the contact pads 40 can comprise a conductive adhesive material, or a conductive adhesive material can be applied between the external contacts 42 and the contact pads 40. In the case of a conductive adhesive, the material can be applied in a semi cured condition, as previously described, and then cured to harden and form a permanent bond.

A compressive bonding process such as thermocompression bonding can also be employed to bond the external contacts 42 on the adjacent substrate 12A to the contact pads 40 on the substrate 12. With thermocompression bonding the external contacts 42 can be heated and compressed at the same time. Weights, or a suitable fixture can be used to bias the panels together as the external contacts 42 are heated to a molten state. Another compressive bonding process can employ external contacts 42 in the form of anisotropic conductive adhesive bumps. Again, weights or a suitable fixture can be used to place the external contacts 42 under compression while the anisotropic conductive adhesive bumps are cured.

Following the bonding process, an outer insulating layer 50 can be formed on the adjacent substrate 12A to electrically insulate the exposed conductors 36 and contact pads 40. For example, the insulating layer 50 can comprise a polymer material, such as polyimide, deposited using a spin on or other suitable process. Also following the bonding process, the stacked panels 10 (FIG. 1) can be sawed, sheared and broken along the boundary lines 16 of the panel 10 to form a plurality of separate stacked packages 14.

In the completed package 14, the external contacts 42 on the substrate 12 provide electrical paths from the outside to the semiconductor dice 20 contained within the packages 14. In addition, the interlevel conductors 44 interconnect the dice 20 to one another. The packages 14 can be used to construct multi chip modules and other electronic assemblies. In some applications the external contacts 42 can be used to form bonded connections with mating electrodes of a supporting substrate such as a PCB, or multi chip module substrate. Although the packages 14 can be constructed with a relatively small peripheral outline, the stacked configuration permits a high packing density for multiple dice 20. In addition, each additional substrate 12 adds a die 20 to the package 14, but only adds about 0.7 mm to 5 mm to the height of the package 14.

Thus the invention provides an improved semiconductor package and method of fabrication. The package includes multiple semiconductor dice mounted to substrates in a stacked configuration. The substrates are configured to provide a small outline package but with multiple semiconductor dice packaged in a high density configuration. In addition, by performing the packaging process with panels rather than individual packages, packaging costs can be reduced, and a high volume process can be provided.

Although the invention has been described with reference to certain preferred embodiments, as will be apparent to those skilled in the art, certain changes and modifications can be made without departing from the scope of the invention as defined by the following claims.

We claim:

1. A method for fabricating semiconductor packages comprising:
   providing a plurality of semiconductor dice comprising a plurality of first pads;
   providing a first panel comprising a plurality of substrates, the first panel comprising a planar first surface, an opposing planar second surface, a plurality of die mounting cavities on the first surface, a plurality of first contacts on the first surface, a plurality of wire bonding cavities on the second surface, a plurality of second pads in the wire bonding cavities, a plurality of second contacts on the second surface in electrical communication with the second pads, a plurality of openings between the die mounting cavities and the wire bonding cavities, and a plurality of interlevel conductors electrically connecting the first contacts and the second contacts;
   providing a second panel substantially identical in construction to the first panel;
   mounting the dice to the die mounting cavities on the first panel and to the die mounting cavities on the second panel;
   bonding wires through the openings to the first pads on the dice and to the second pads in the wire bonding cavities;
   stacking the first surface of the first panel on the second surface of the second panel;
   bonding the first contacts on the first surface of the first panel to the second contacts on the second surface of the second panel; and
   separating the substrates from the first panel and the second panel.

2. The method of claim 1 wherein the first panel and the second panel comprise a glass filled resin.

3. The method of claim 1 wherein the first contacts and the second contacts comprise solder.

4. The method of claim 3 wherein the bonding step comprises reflowing the solder.

5. The method of claim 1 wherein the first contacts and the second contacts comprise an electrically conductive elastomer.

6. The method of claim 5 wherein the bonding step comprises curing the elastomer.

7. A method for fabricating a semiconductor package comprising:
   providing a first substrate on a first panel having a first planar surface, the first panel comprising a plurality of first substrates;
   providing a second substrate on a second panel having a second planar surface, the second panel comprising a plurality of second substrates;
   the first substrate and the second substrate each comprising a first side, a plurality of first contacts on the first side in a pattern, an opposing second side, a plurality of second contacts on the second side in the pattern, and a plurality of interlevel conductors electrically connecting the first contacts and the second contacts;
   wire bonding a first semiconductor die to the first substrate in electrical communication with the first contacts and the second contacts thereon such that the first planar surface remains planar;
   wire bonding a second semiconductor die to the second substrate in electrical communication with the first contacts and the second contacts thereon such that the second planar surface remains planar;
   stacking the first panel to the second panel with the first planar surface on the second planar surface and the first substrate on the second substrate;
   following the stacking step, bonding the first contacts on the first substrate to the second contacts on the second substrate; and
   following the bonding step, separating the first substrate and the second substrate in a stack from the first panel and the second panel.

8. The method of claim 7 wherein the first contacts and the second contacts comprise solder and the bonding step comprises solder reflow.

9. The method of claim 7 wherein the first contacts and the second contacts comprise an electrically conductive elastomer and the bonding step comprises curing the elastomer.

10. The method of claim 7 wherein the first substrate and the second substrate comprise a glass filled resin.

11. A method for fabricating a semiconductor package comprising:
   providing a first panel comprising a plurality of substrates, each substrate comprising a first side with a plurality of first contacts thereon, an opposing second side with a plurality of second contacts thereon, and a plurality of interlevel conductors electrically connecting the first contacts and the second contacts;
   providing a second panel substantially identical to the first panel;
   mounting a plurality of dice to the substrates in electrical communication with the first contacts and the second contacts thereon, the dice mounted to the substrates such that each panel has a planar first surface and a planar second surface;
   stacking the second panel to the first panel with the planar first surface on the first panel proximate to the planar second surface on the second panel;
   following the stacking step, bonding the second contacts on the second panel to the first contacts on the first panel; and following the bonding step, separating the substrates from the first panel and from the second panel.

12. The method of claim 11 wherein the first contacts and the second contacts comprise solder and the bonding step comprises reflowing the solder.

13. The method of claim 11 wherein the substrates comprise a plurality of die mounting cavities on the first planar surface.

14. The method of claim 11 wherein the substrates comprise a plurality of wire bonding cavities on the second planar surface and the mounting step comprises wire bonding.

15. A method for fabricating a semiconductor package comprising:

providing a substrate on a first panel containing a plurality of identical substrates, the substrate comprising a first side, an opposing second side, a first cavity in the first side, a second cavity in the second side, a plurality of first pads in the first cavity, a plurality of first contacts on the first side in electrical communication with the first pads, a plurality of second contacts on the second side having a same pattern as the first contacts, an opening between the first cavity and the second cavity and a plurality of interlevel conductors electrically connecting the first contacts to the second contacts;

mounting a die comprising a plurality of second pads to the second cavity with the second pads aligned with the opening and with the second side generally planar;

wire bonding a plurality of wires in the opening to the first pads and to the second pads and with the first side generally planar;

providing a second substrate substantially identical to the substrate on a second panel containing a plurality of identical second substrates, the second substrate having a second die mounted and wire bonded thereto;

stacking the first panel on the second panel to form a stack with the second side of the substrate on the first side of the second substrate;

following the stacking step, bonding the second contacts on the substrate to the first contacts on the second substrate; and following the bonding step separating the substrate and the second substrate from the stack.

16. The method of claim 15 further comprising encapsulating the wires in a generally planar encapsulant in the second cavity.

17. The method of claim 15 further comprising performing the bonding step by bonding the first panel to the second panel.

18. The method of claim 15 wherein the separating step is performed by cutting, breaking or shearing the stack.

19. The method of claim 15 wherein the bonding step comprises a solder reflow.

20. The method of claim 15 wherein the bonding step comprises curing a conductive elastomer.

21. The method of claim 15 wherein the first substrate and the second substrate comprise a material selected from the group consisting of silicon, plastic, ceramic and glass filled resin.

* * * * *